United States Patent
Terai et al.

(10) Patent No.: US 9,502,492 B2
(45) Date of Patent: Nov. 22, 2016

(54) SEMICONDUCTOR DEVICE, METHOD OF MANUFACTURING THE SAME, DISPLAY UNIT, AND ELECTRONIC APPARATUS

(71) Applicant: Sony Corporation, Tokyo (JP)

(72) Inventors: Yasuhiro Terai, Kanagawa (JP); Naobumi Toyomura, Kanagawa (JP)

(73) Assignee: Joled Inc., Tokyo (JP)

( * ) Notice: Subject to any disclaimer, the term of this patent is extended or adjusted under 35 U.S.C. 154(b) by 40 days.

(21) Appl. No.: 14/312,126

(22) Filed: Jun. 23, 2014

(65) Prior Publication Data

US 2015/0008427 A1 Jan. 8, 2015

(30) Foreign Application Priority Data

Jul. 8, 2013 (JP) .................................. 2013-142808

(51) Int. Cl.
*H01L 29/10* (2006.01)
*H01L 49/02* (2006.01)
*H01L 27/12* (2006.01)

(52) U.S. Cl.
CPC ........... *H01L 28/60* (2013.01); *H01L 27/1225* (2013.01); *H01L 27/1255* (2013.01)

(58) Field of Classification Search
CPC ........... H01L 21/7687; H01L 27/0288; H01L 27/0647; H01L 28/40
See application file for complete search history.

(56) References Cited

U.S. PATENT DOCUMENTS

2006/0273316 A1\* 12/2006 Yang et al. ..................... 257/59
2010/0245307 A1\* 9/2010 Kimura et al. ............... 345/206

FOREIGN PATENT DOCUMENTS

JP 2011-100091 5/2011

\* cited by examiner

*Primary Examiner* — Elias M Ullah
(74) *Attorney, Agent, or Firm* — K&L Gates LLP

(57) ABSTRACT

A semiconductor device includes: a capacitor including a first insulating film between a lower electrode and an upper electrode; and a first laminated structure including a second insulating film and a semiconductor film, the second insulating film and the semiconductor film being located between part or all of a rim of the lower electrode and the first insulating film.

16 Claims, 17 Drawing Sheets

SEMICONDUCTOR DEVICE, METHOD OF MANUFACTURING THE SAME, DISPLAY UNIT, AND ELECTRONIC APPARATUS

CROSS REFERENCES TO RELATED APPLICATIONS

The present application claims priority to Japanese Priority Patent Application JP 2013-142808 filed in the Japan Patent Office on Jul. 8, 2013, the entire content of which is hereby incorporated by reference.

BACKGROUND

The present application relates to a semiconductor device having a capacitor, to a method of manufacturing the semiconductor device, to a display unit, and to an electronic apparatus.

An oxide containing oxide zinc (Zn) and/or indium (In) shows superior characteristics as an active layer of a semiconductor device, and in recent years, development has been promoted in an effort to apply such an oxide to a TFT, a light emitting device, a transparent conducting film, and the like. In particular, a TFT using a composite oxide of Zn, In, and Ga has large electron mobility and shows superior electric characteristics, compared to a TFT using amorphous silicon (a-Si: H) that is generally used for a liquid crystal display and the like.

In the past, as a TFT (a Thin Film Transistor) using the foregoing oxide semiconductor, a bottom-gate-type TFT and a top-gate-type TFT have been reported. In the structure of the bottom-gate-type TFT, a thin film layer of the oxide semiconductor is provided on a gate electrode with a gate insulating film in between. Such a structure is similar to a TFT structure using amorphous silicon as a channel that is currently commercialized. Therefore, since the existing manufacturing process of the TFT using amorphous silicon is easily diverted, the structure of the bottom-gate-type TFT has been often used in the TFT utilizing the oxide semiconductor as well.

For example, in a display unit, a capacitor is provided together with a TFT for driving a display element (for example, Japanese Unexamined Patent Application Publication No. 2011-100091). The capacitor has an insulating film as a dielectric film between a pair of electrodes (an upper electrode and a lower electrode).

SUMMARY

It is desirable that the capacitor increase the capacity value while maintaining insulation properties between the electrodes.

It is desirable to provide a semiconductor device, a method of manufacturing the semiconductor device, a display unit, and an electronic apparatus that are capable of maintaining insulation properties between electrodes of a capacitor, while improving the capacity value thereof.

According to an embodiment of the present application, there is provided a semiconductor device, including: a capacitor including a first insulating film between a lower electrode and an upper electrode; and a first laminated structure including a second insulating film and a semiconductor film, the second insulating film and the semiconductor film being located between part or all of a rim of the lower electrode and the first insulating film.

In the semiconductor device according to the above-described embodiment of the present application, the first laminated structure including the second insulating film and the semiconductor film is provided on the rim of the lower electrode. Therefore, on a rim section of the lower electrode, the second insulating film is arranged in addition to the first insulating film as an insulating film between the lower electrode and the upper electrode. The shape of the rim section of the lower electrode is easily disordered at the time of forming the electrode. Such a rim section of the lower electrode is covered with the first insulating film and the second insulating film.

According to an embodiment of the present application, there is provided a display unit provided with a display layer and a semiconductor device driving the display layer, the semiconductor device including: a capacitor including a first insulating film between a lower electrode and an upper electrode; and a first laminated structure including a second insulating film and a semiconductor film, the second insulating film and the semiconductor film being located between part or all of a rim of the lower electrode and the first insulating film.

According to an embodiment of the present application, there is provided an electronic apparatus provided with a display unit including a display layer and a semiconductor device driving the display layer, the semiconductor device including: a capacitor having a first insulating film between a lower electrode and an upper electrode; and a first laminated structure including a second insulating film and a semiconductor film, the second insulating film and the semiconductor film being located between part or all of a rim of the lower electrode and the first insulating film.

According to an embodiment of the present application, there is provided a method of manufacturing a semiconductor device, the method including: forming a lower electrode; forming a laminated structure on part or all of a rim of the lower electrode, the laminated structure including an insulating film (a second insulating film) and a semiconductor film; and providing an upper electrode to be opposed to the lower electrode and the laminated structure with a first insulating film in between to form a capacitor.

In the semiconductor device, the method of manufacturing the same, the display unit, and the electronic apparatus according to the above-described embodiments of the present application, in addition to the first insulating film between the lower electrode and the upper electrode, the first laminated structure including the second insulating film and the semiconductor film is provided on the rim of the lower electrode. Therefore, the thickness of the insulating film between the electrodes of such a portion (the rim section of the lower electrode) is allowed to be increased compared to those of the other portions. Therefore, while insulation properties between the electrodes are retained, the capacity value is allowed to be increased.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 13 is a plan view illustrating a schematic configuration of a module including the display unit illustrated in FIG. 1 and the like.

DETAILED DESCRIPTION

An embodiment of the present application will be described below in detail with reference to the drawings.

Embodiment

Figure 1:
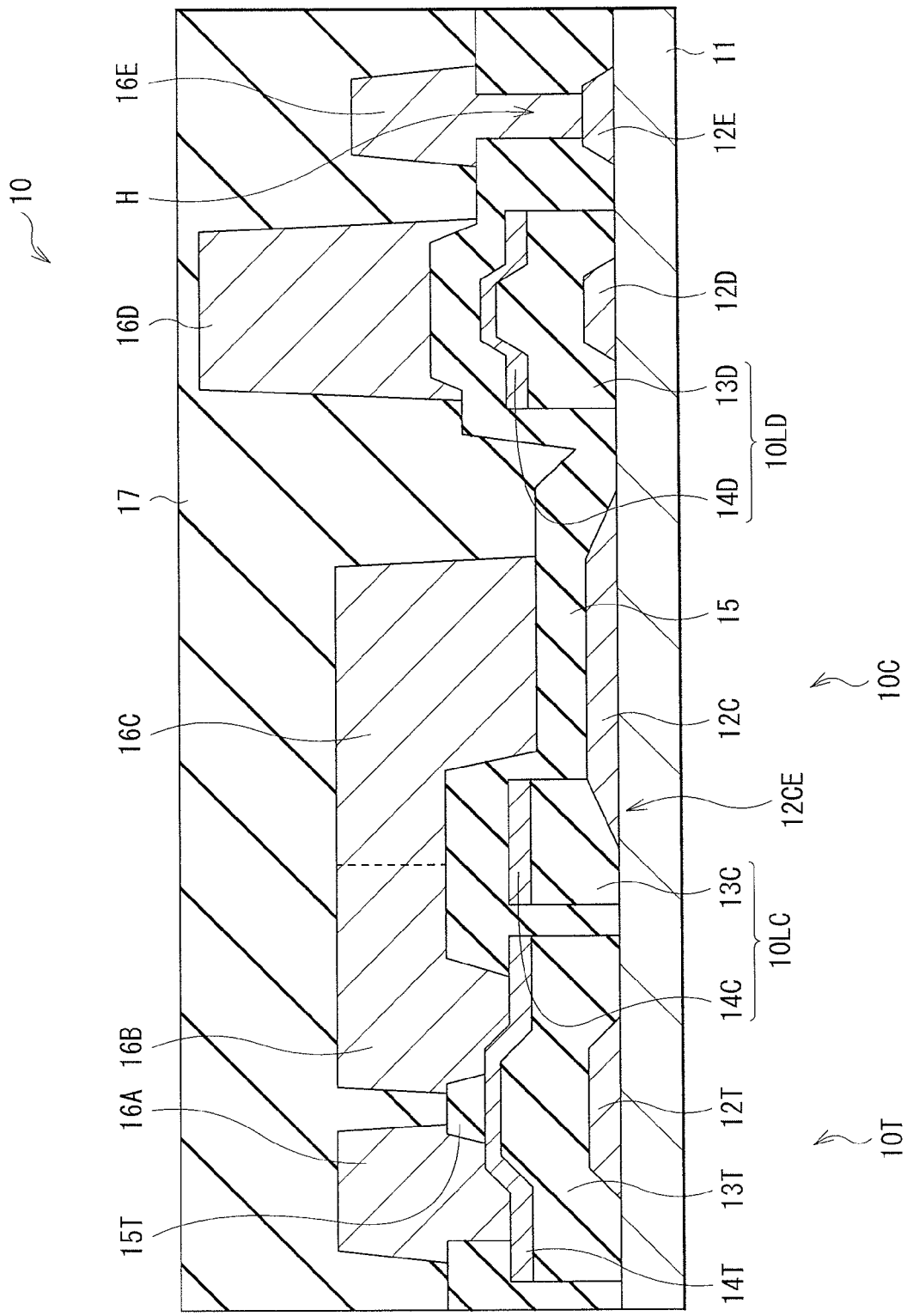
FIG. 1 is a cross-sectional view illustrating a configuration of a semiconductor device according to a first embodiment of the present application.

FIG. 1 illustrates a cross-sectional configuration of a semiconductor device (a semiconductor device 10) according to an embodiment of the present application. The semiconductor device 10 may be used, for example, for driving a display element (an after-described display element 100D in FIG. 3) of a display unit (an after-described display unit 1 in FIG. 2). The semiconductor device 10 has a transistor 10T, a capacitor 10C, and various wirings (a first wiring 12D, a second wiring 16D, a third wiring 12E, and a fourth wiring 16E) on a substrate 11.

Figure 2:
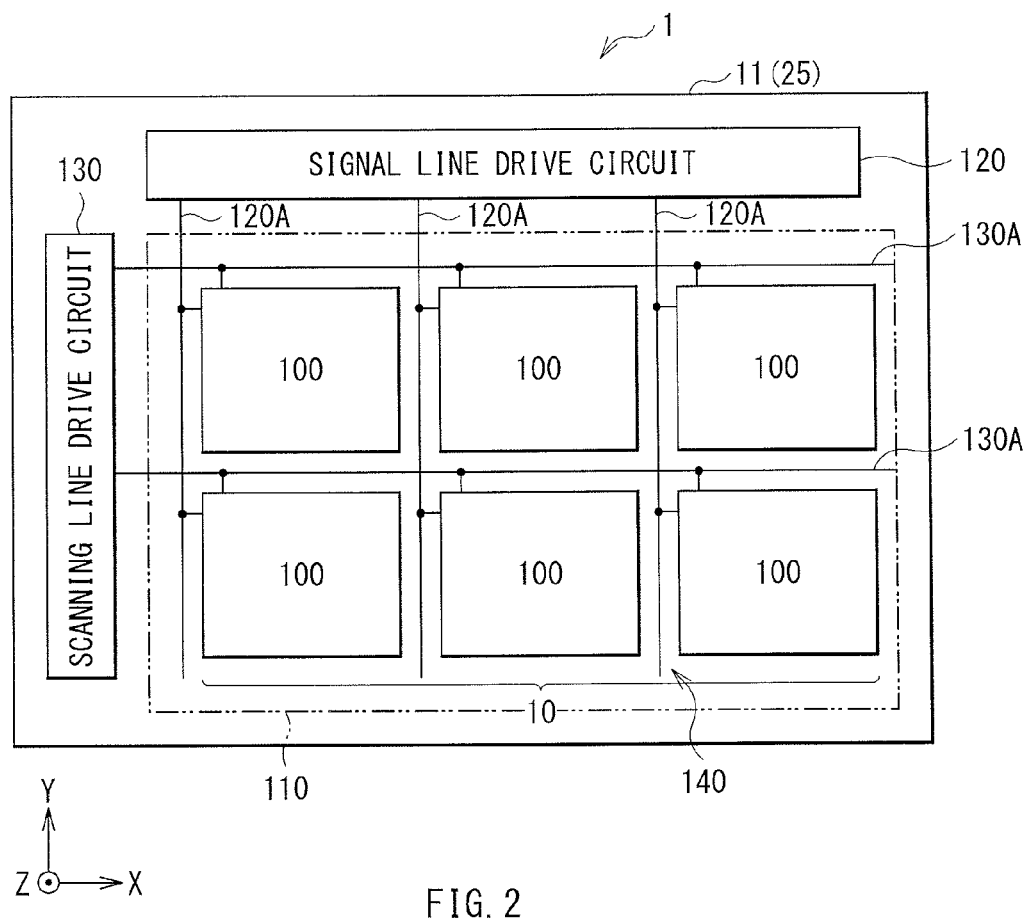
FIG. 2 is a diagram illustrating an example of a whole configuration of a display unit having the semiconductor device illustrated in FIG. 1.

FIG. 2 illustrates an example of a whole configuration of a display unit (the display unit 1) utilizing the semiconductor device 10. The display unit 1 may include, for example, a display layer such as a liquid crystal layer and an organic EL (Electroluminescence) layer between the substrate 11 and an opposed substrate 25. The display layer is driven for every pixel 100 by the semiconductor device 10. In a display region 110, the pixels 100 are two-dimensionally arranged in a matrix, and a pixel drive circuit 140 for driving the pixels 100 is provided. In the pixel drive circuit 140, a plurality of signal lines 120A (120A1, 120A2, . . . , 120Am, . . . ) are arranged in a column direction (Y direction), and a plurality of scanning lines 130A (130A1, . . . , 130An, . . . ) are arranged in a row direction (X direction). One pixel 100 is provided in one intersection of the signal line 120A and the scanning line 130A. Both ends of the signal line 120A are connected to a signal line drive circuit 120, and both ends of the scanning line 130A are connected to a scanning line drive circuit 130.

The signal line drive circuit 120 is configured to supply a signal voltage of an image signal corresponding to luminance information supplied from a signal supply source (not illustrated) to the pixel 100 selected through the signal line 120A. The scanning line drive circuit 130 is configured of a shift resistor or the like that sequentially shifts (transfers) a start pulse in synchronization with an inputted clock pulse. The scanning line drive circuit 130 is configured to scan writing of image signals into the respective pixels 100 in units of row, and sequentially supply scanning signals to the respective scanning lines 130A. Signal voltages from the signal line drive circuit 120 are applied to the signal lines 120A, and scanning signals from the scanning line drive circuit 130 are supplied to the scanning lines 130A.

Figure 3:
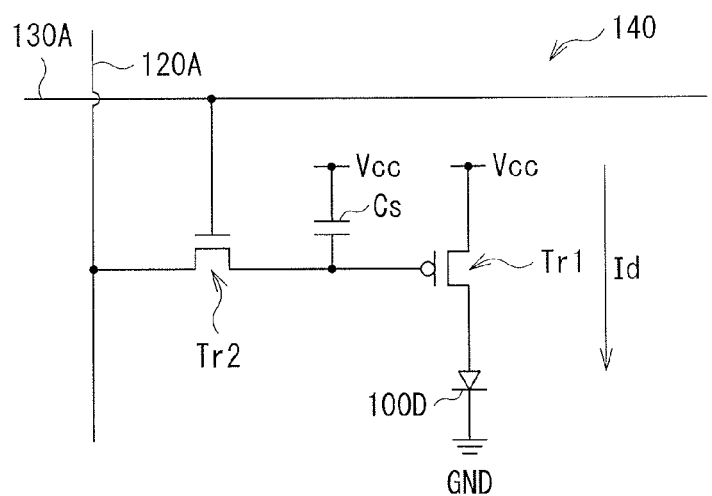
FIG. 3 is a diagram illustrating an example of a pixel drive circuit illustrated in FIG. 2.

FIG. 3 illustrates a configuration example of the pixel drive circuit 140. For example, the foregoing semiconductor device 10 may configure the pixel drive circuit 140. The pixel drive circuit 140 is an active-type drive circuit having a drive transistor Tr1, a writing transistor Tr2, a capacitor (a capacitor 10C) between the drive transistor Tr1 and the writing transistor Tr2, and the display element 100D such as an organic EL element. The display element 100D is connected to the drive transistor Tr1 in series. One or both of the drive transistor Tr1 and the writing transistor Tr2 are configured of the transistor 10T of the semiconductor device 10.

[Configurations of Main Sections of Semiconductor Device]

Next, description will be given of detailed configurations of the semiconductor device 10 with reference to FIG. 1 again.

The transistor 10T is a bottom-gate-type (inversely-staggered-type) thin film transistor having a gate electrode 12T, a gate insulating film 13T, a channel film 14T, and source-drain electrodes 16A and 16B in this order on the substrate 11. The central portion of the channel film 14T is covered with a channel protective film 15T.

The substrate 11 is formed of a glass substrate, a plastic film, or the like. Examples of plastic materials may include PET (polyethylene terephthalate) and PEN (polyethylene naphthalate). As long as a semiconductor layer 14 is allowed to be formed without heating the substrate 11 by a sputtering method or the like, an inexpensive plastic film may be used for the substrate 11.

The gate electrode 12T has a role to apply a gate voltage to the transistor 10T and to control carrier density in the channel film 14T by the gate voltage. The gate electrode 12T having, for example, a thickness from 100 nm to 500 nm both inclusive may be provided in a selective region on the substrate 11. The gate electrode 12T may be made of a metal simple substance such as platinum (Pt), titanium (Ti), ruthenium (Ru), molybdenum (Mo), copper (Cu), tungsten (W), nickel (Ni), aluminum (Al), and tantalum (Ta), or an alloy thereof. Further, the gate electrode 12T may be formed of a transparent electrically-conductive thin film such as indium tin oxide (ITO), indium zinc oxide (IZO), and zinc oxide (ZnO). The gate electrode 12T may be, for example, tapered, and side surfaces of the gate electrode 12T are slanted with respect to the substrate 11.

The gate insulating film 13T covers the gate electrode 12T, is provided between the gate electrode 12T and the channel film 14T, and may have a thickness, for example, from 100 nm to 500 nm both inclusive. The gate insulating film 13T is patterned into the same planar shape as that of the channel film 14T. The gate insulating film 13T may be formed of an insulating film including, for example, one or more of a silicon oxide film, a silicon nitride film, a silicon oxynitride film, a hafnium oxide film, an aluminum oxide film, an aluminum nitride film, a tantalum oxide film, a zirconium oxide film, a hafnium oxynitride film, a hafnium silicon oxynitride film, an aluminum oxynitride film, a tantalum oxynitride film, and a zirconium oxynitride film. The gate insulating film 13T may have a single-layer structure, or a laminated structure configured of two or more materials. In the case where the gate insulating film 13T has the laminated structure configured of two or more materials, interface characteristics with respect to the channel film 14T are allowed to be improved, and intrusion of impurity from ambient air into the channel film 14T is allowed to be suppressed.

The island-shaped channel film 14T is opposed to the gate electrode 12T with the gate insulating film 13T in between, and is in contact with the source-drain electrodes 16A and 16B. In the channel film 14T, a channel region is formed in a location opposed to the gate electrode 12T between the source-drain electrode 16A and the source-drain electrode 16B. The channel film 14T may be formed of an oxide semiconductor containing, as a main component, an oxide configured of one or more of elements such as indium (In), gallium (Ga), zinc (Zn), tin (Sn), zirconium (Zr), aluminum (Al), and titanium (Ti). Specific examples thereof may include a transparent oxide semiconductor having zinc oxide as a main component such as indium gallium zinc oxide (IGZO), zinc oxide, aluminum-doped zinc oxide (AZO), and gallium doped zinc oxide (GZO). The thickness of the channel film 14T may be preferably, for example, from 5 nm to 100 nm both inclusive in view of oxygen supply efficiency by annealing in the manufacturing process. The channel film 14T may be amorphous or crystalline. However, in the case where the channel film 14T is crystalline, resistance to an etching solution is improved, which facilitates application to formation of a device structure. For example, crystallinity may be improved by setting the indium ratio or the tin ratio to a higher value than ratios of other constituent elements.

The channel protective film 15T is provided on the channel region of the channel film 14T, and is configured to prevent damage of the channel film 14T at the time of forming the source-drain electrodes 16A and 16B. In the channel film 14T made of the oxide semiconductor material, an oxidation-reduction reaction occurs in the manufacturing process, and the characteristics thereof are easily changed. In particular, in the bottom-gate-type transistor 10T, by back channel etching at the time of forming the source-drain electrodes 16A and 16B, the channel film 14T may be degraded, and electric characteristics and reliability of the transistor 10T may be lowered. The channel protective film 15T is configured to prevent such degradation of the channel film 14T, and may be formed, for example, of a silicon oxide film, a silicon nitride film, an aluminum oxide film, or the like having a thickness of 50 nm to 400 nm both inclusive. The thickness of the channel protective film 15T may be preferably smaller than that of the gate insulating film 13T. The channel protective film 15T may be formed by laminating a plurality types of insulating films.

The source-drain electrodes 16A and 16B are provided from ends of the channel protective film 15T to cover the channel film 14T, and are electrically connected to the channel film 14T. That is, opposed surfaces of the source-drain electrodes 16A and 16B are arranged on the channel protective film 15T, and the source-drain electrodes 16A and 16B have regions overlapped with the gate electrode 12T. Such source-drain electrodes 16A and 16B are formed of a single-layer film configured of a metal film that is made, for example, of molybdenum, aluminum, copper, titanium, ITO, or an alloy thereof, or are formed of a laminated film configured of two or more of such metal films. For example, in the case where the source-drain electrodes 16A and 16B are formed of a three-layer film in which a molybdenum layer being 50 nm thick, an aluminum layer being 500 nm thick, and a molybdenum layer being 50 nm thick are laminated in order, electric characteristics of the channel film 14T are allowed to be stably retained. Further, a metal film containing oxygen such as an ITO film and a titanium oxide film other than the molybdenum film may be in contact with the channel film 14T. In the case where the channel film 14T made of an oxide semiconductor material is in contact with a metal film easily extracting oxygen, oxygen of the oxide semiconductor is extracted, and a defect is formed. Therefore, by using the metal film containing oxygen for a portion in contact with the channel film 14T out of the source-drain electrodes 16A and 16B, electric characteristics of the transistor 10T are allowed to be stabilized.

The capacitor 10C includes a lower electrode 12C, an upper electrode 16C, and a dielectric layer (a first insulating film 15) between the lower electrode 12C and the upper electrode 16C. Such a capacitor 10C may be arranged, for example, in a location adjacent to the transistor 10T. The lower electrode 12C of the capacitor 10C may be arranged, for example, in the same layer as that of the gate electrode 12T of the transistor 10T. The upper electrode 16C is provided integrally with the source-drain electrode 16B. The lower electrode 12C may be made, for example, of the same electrically conductive material as that of the gate electrode 12T, and has the approximately same thickness as that of the gate electrode 12T. The lower electrode 12C may have, for example, a taper shape as the gate electrode 12T does.

In this embodiment, on a rim section 12CE of the lower electrode 12C, a laminated structure 10LC (a first laminated structure) including a second insulating film 13C and a semiconductor film 14C is provided. That is, the laminated structure 10LC covers the rim section 12CE of the lower electrode 12C. In the rim section 12CE of the lower electrode 12C, in addition to the first insulating film 15, the laminated structure 10LC exists between the lower electrode 12C and the upper electrode 16C. In regions other than the rim section 12CE, the first insulating film 15 is in contact with the lower electrode 12C and the upper electrode 16C. Thereby, while insulation properties of the capacitor 10C are retained, the capacity value of the capacitor 10C is allowed to be improved, though detailed description will be given later. It is to be noted that the rim section 12CE of the lower electrode 12C refers to a section including at least a portion inside the lower electrode 12C. However, a region outside the lower electrode 12C may be included in the rim section 12CE.

The planar shapes of the second insulating film 13C and the semiconductor film 14C that configure the laminated structure 10LC are the same as each other. The planar shape of the second insulating film 13C and the planar shape of the semiconductor film 14C may be somewhat different due to, for example, manufacturing errors and/or the like. It may be preferable that such a laminated structure 10LC be provided from the top surface (the surface opposed to the upper electrode 16C) of the lower electrode 12C to the side surface thereof, and the whole side surface of the tapered lower electrode 12C be covered with the laminated structure 10LC. In the rim section 12CE of the lower electrode 12C, the lower electrode 12C, the second insulating film 13C, the semiconductor film 14C, the first insulating film 15, and the upper electrode 16C are provided in this order. For the second insulating film 13C, a material similar to that of the gate insulating film 13T may be used. For the semiconductor film 14C, a material similar to that of the channel film 14T may be used. For example, the second insulating film 13C and the gate insulating film 13T may be made of the same material, and the semiconductor film 14C and the channel film 14T may be made of the same material. The thickness of the second insulating film 13C may be, for example, substantially the same as the thickness of the gate insulating film 13T. The thickness of the semiconductor film 14C may be, for example, substantially the same as the thickness of the channel film 14T.

Figure 4:
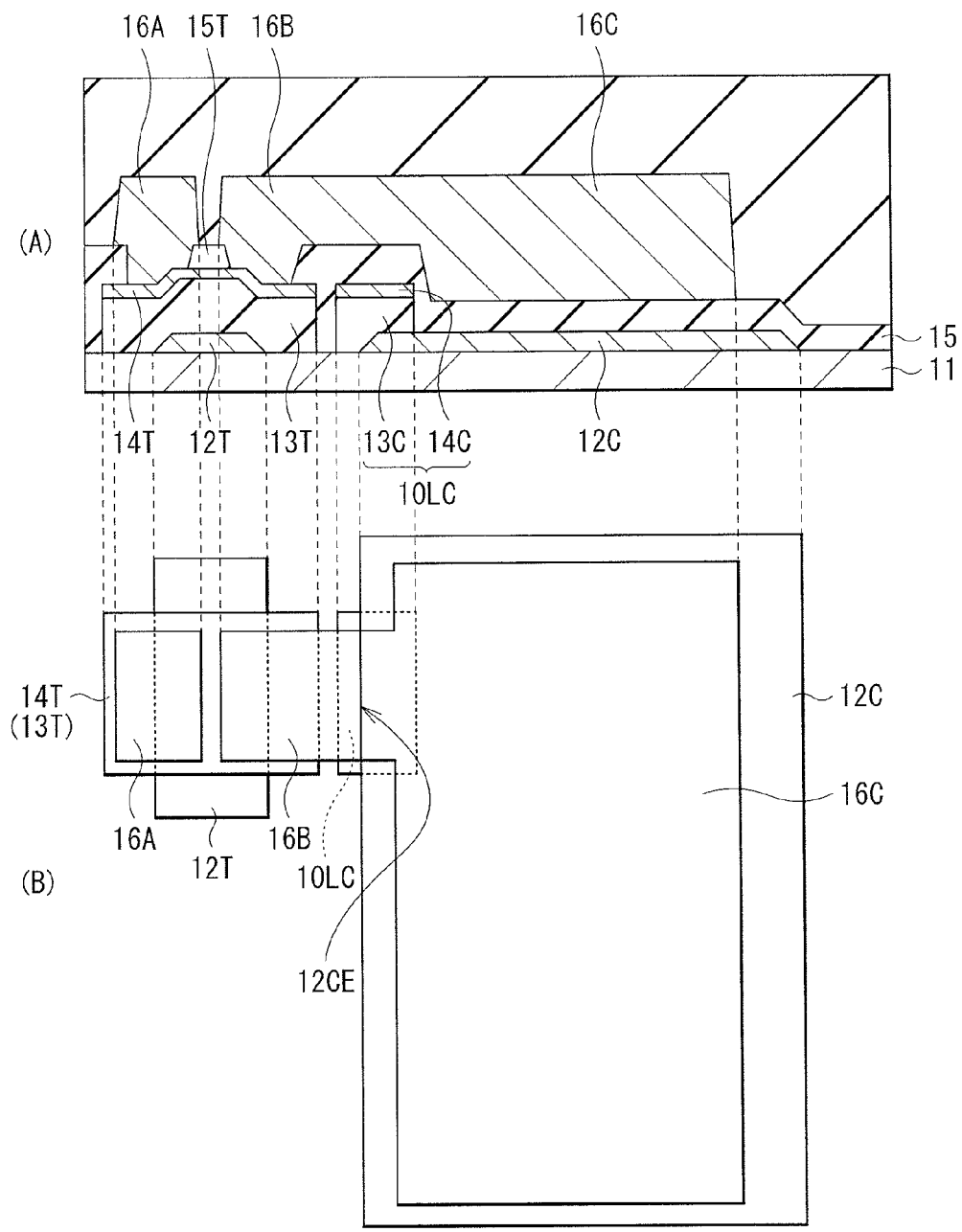
FIG. 4 is a diagram for explaining a plane configuration of the semiconductor device illustrated in FIG. 1.

Part (A) of FIG. 4 illustrates cross-sectional configurations of the transistor 10T and the capacitor 10C, and Part (B) of FIG. 4 illustrates plane configurations thereof. Part of the upper electrode 16C is projected outside the rim of the lower electrode 12C, and is linked to the source-drain electrode 16B of the transistor 10T. In other words, in the lower electrode 12C, part of the rim is covered with a projecting portion of the upper electrode 16C. The laminated structure 10LC is provided on the rim section 12CE including a region opposed to the foregoing projecting portion of the upper electrode 16C out of the rim of the lower electrode 12C. In portions other than a portion linked to the source-drain electrode 16B, the upper electrode 16C is arranged inside the lower electrode 12C. For the upper electrode 16C, a material similar to that of the source-drain electrodes 16A and 16B may be used. For example, the upper electrode 16C may be made of the same material as that of the source-drain electrodes 16A and 16B.

The first insulating film 15 covers ends of the channel film 14T of the transistor 10T, and extends between the lower electrode 12C and the upper electrode 16C. That is, the first insulating film 15 is provided between the channel film 14T of the transistor 10T and the semiconductor film 14C of the laminated structure 10LC. The thickness of the first insulating film 15 between the lower electrode 12C and the upper electrode 16C may be, for example, from 50 nm to 300 nm both inclusive, and may be preferably smaller than the thickness of the second insulating film 13C. The ratio between the thickness of the first insulating film 15 and the thickness of the second insulating film 13C may be, for example, in the range from 1:10 to 1:1.2. The first insulating film 15 may be made, for example, of the same material as that of the channel protective film 15T.

The semiconductor device 10 may have, for example, a first wiring 12D and a third wiring 12E in the same layer as that of the lower electrode 12C of the capacitor 10C and the gate electrode 12T of the transistor 10T. In a layer higher than the first wiring 12D, a second wiring 16D extends. A laminated structure 10LD (a second laminated structure) and the first insulating film 15 exist between the first wiring 12D and the second wiring 16D that are opposed to each other. The laminated structure 10LD between the first wiring 12D and the second wiring 16D is similar to the foregoing laminated structure 10LC provided on the rim section 12CE of the lower electrode 12C, and includes a second insulating film 13D and a semiconductor film 14D. For the second insulating film 13D and the semiconductor film 14D, materials similar to those of the second insulating film 13C and the semiconductor film 14C may be used respectively. For example, the second insulating film 13D and the semiconductor film 14D may be made of the same materials as those of the second insulating film 13C and the semiconductor film 14C respectively.

A fourth wiring 16E is electrically connected to the third wiring 12E through a connection hole H penetrating through the first insulating film 15. The fourth wiring 16E may be buried, for example, in the connection hole H. For each of the first wiring 12D and the third wiring 12E, for example, a material similar to that of the lower electrode 12C may be used. For the second wiring 16D and the fourth wiring 16E, for example, a material similar to that of the upper electrode 16C may be used.

The transistor 10T, the capacitor 10C, the second wiring 16D, and the fourth wiring 16E are covered with a passivation film 17. The passivation film 17 is configured to protect the transistor 10T, the capacitor 10C, and the wirings (the first wiring 12D, the second wiring 16D, the third wiring 12E, and the fourth wiring 16E), and may be made, for example, of a metal oxide such as aluminum oxide and titanium oxide. For the passivation film 17, a metallic acid nitride such as aluminum oxynitride and titanium oxynitride may be used.

The semiconductor device 10 may be manufactured, for example, as follows (FIG. 5A to FIG. 6C).

Figure 5A:
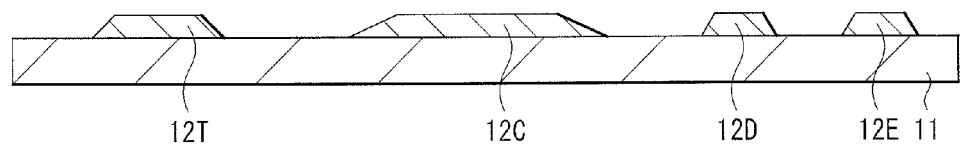
FIG. 5A is a cross-sectional view illustrating a step of manufacturing the semiconductor device illustrated in FIG. 1.

First, a metal thin film may be formed on the whole surface of the substrate 11 with the use, for example, of a sputtering method and a CVD (Chemical Vapor Deposition) method. Next, the metal thin film is patterned with the use of a photolithography and an etching method, and thereby, the gate electrode 12T, the lower electrode 12C, the first wiring 12D, and the third wiring 12E are formed (FIG. 5A).

Figure 5B:
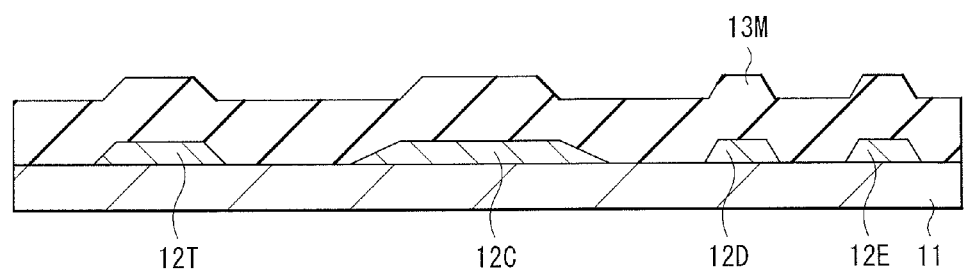
FIG. 5B is a cross-sectional view illustrating a step following the step of FIG. 5A.

Subsequently, as illustrated in FIG. 5B, on the whole surface of the substrate 11 provided with the gate electrode 12T, the lower electrode 12C, the first wiring 12D, and the third wiring 12E, an insulating material film 13M formed of a laminated film configured of a silicon nitride film and a silicon oxide film may be formed, for example, by a plasma CVD method. Such formation of the insulating material film 13M by the plasma CVD method may be performed by forming the silicon nitride film with the use, for example, of gas such as silane, ammonia ($NH_3$), and nitrogen ($N_2$) as raw material gas, and forming the silicon oxide film with the use, for example, of gas including silane, dinitrogen monoxide, and/or the like as raw material gas. Further, the insulating material film 13M may be formed by a sputtering method instead of the plasma CVD method. In the sputtering method, the insulating material film 13M formed of a silicon oxide film, a silicon nitride film, or the like may be formed by performing reactive plasma sputtering by flowing oxygen, moisture vapor, nitrogen, and/or the like into sputtering discharge atmosphere with the use, for example, of silicon as a target.

Figure 5C:
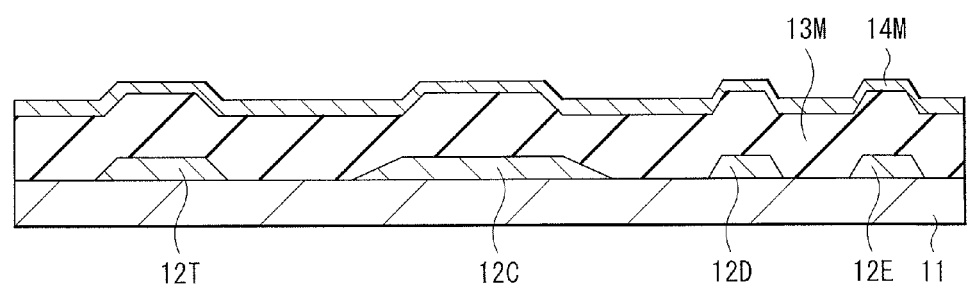
FIG. 5C is a cross-sectional view illustrating a step following the step of FIG. 5B.

After the insulating material film 13M is provided, as illustrated in FIG. 5C, on the whole surface of the insulating material film 13M, a semiconductor material film 14M made, for example, of an oxide semiconductor material may be formed, for example, by a sputtering method. In the case where indium gallium zinc oxide is used as the oxide semiconductor material, plasma discharge using mixed gas of argon (Ar) and oxygen ($O_2$) is performed by a DC (Direct Current) sputtering method with the use of indium gallium zinc oxide ceramic as a target. It is to be noted that introduction of argon and oxygen gas is performed after evacuating air in a vacuum container until the vacuum degree becomes a value equal to or less than $1 \times 10^4$ Pa before the plasma discharge.

Further, in the case where zinc oxide is used as the oxide semiconductor material, an RF (Radio Frequency) sputtering method with the use of zinc oxide ceramic as a target is performed. Alternatively, a sputtering method using a DC electric power source may be performed in gas atmosphere including argon and oxygen with the use of zinc as a metal target.

At this time, the carrier density of the semiconductor material film 14M may be controlled by changing the flow ratios of argon and oxygen at the time of forming an oxide.

Further, in the case where a crystalline oxide semiconductor is used as the oxide semiconductor material, crystallization annealing treatment, for example, by irradiation with laser light or the like may be performed after formation of the oxide semiconductor material. Examples of crystalline materials may include an oxide semiconductor configured of zinc oxide, indium, gallium, zirconium, tin, and/or the like in which the indium ratio or the tin ratio is higher than ratios of the other constitutional elements.

Figure 6A:
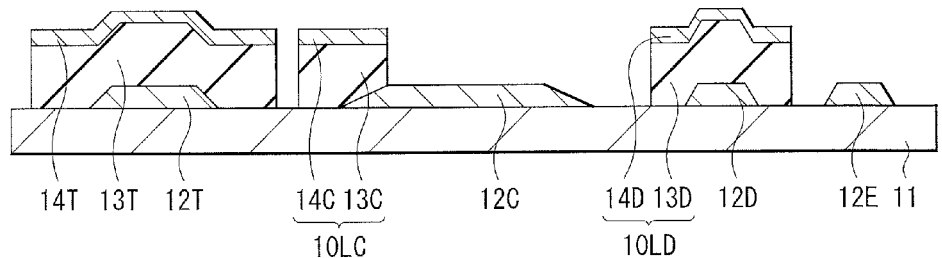
FIG. 6A is a cross-sectional view illustrating a step of manufacturing the semiconductor device illustrated in FIG. 1.

After the semiconductor material film 14M is formed, as illustrated in FIG. 6A, the semiconductor material film 14M and the insulating material film 13M are patterned with the use of the same mask. Thereby, the laminated structure 10LC including the second insulating film 13C and the semiconductor film 14C and the laminated structure 10LD including the second insulating film 13D and the semiconductor film 14D are formed together with the gate insulating film 13T and the channel film 14T on the gate electrode 12T. In other words, the semiconductor material film 14M and the insulating material film 13M located in portions other than the formation portion of the gate insulating film 13T and the channel film 14T and the formation portions of the laminated structures 10LC and 10LD are removed. Therefore, the insulating material film 13M on the third wiring 12E is also removed. For the patterning of the semiconductor material film 14M and the insulating material film 13M, for example, photolithography and an etching method may be used. With regard to the etching, either wet etching or dry etching may be used. Since the oxide semiconductor material is easily dissolved in acid and alkali, wet etching may be performed on the semiconductor material film 14M and dry etching may be performed on the insulating material film 13M.

Figure 6B:
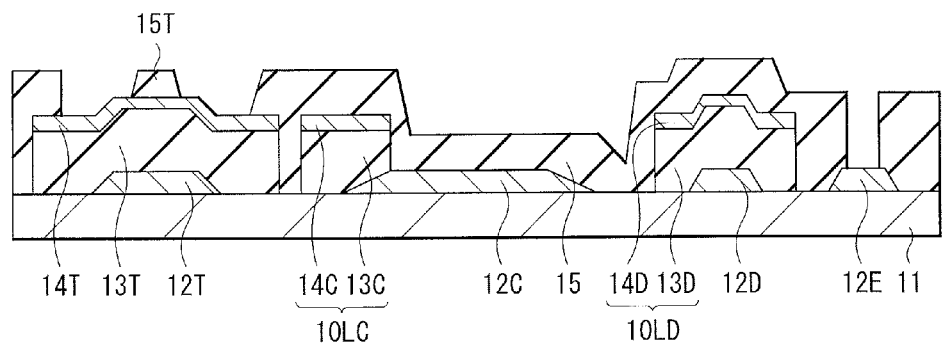
FIG. 6B is a cross-sectional view illustrating a step following the step of FIG. 6A.

After patterning the semiconductor material film 14M and the insulating material film 13M, as illustrated in FIG. 6B, the channel protective film 15T and the first insulating film 15 are formed. The channel protective film 15T and the first insulating film 15 may be formed by forming an insulating film (not illustrated) such as a silicon oxide film and a silicon nitride film on the whole surface of the substrate 11, and subsequently, patterning the insulating film by photolithography and etching with the use of a common mask. At this time, the connection hole H reaching the wiring 12E is formed in the first insulating film 15.

Figure 6C:
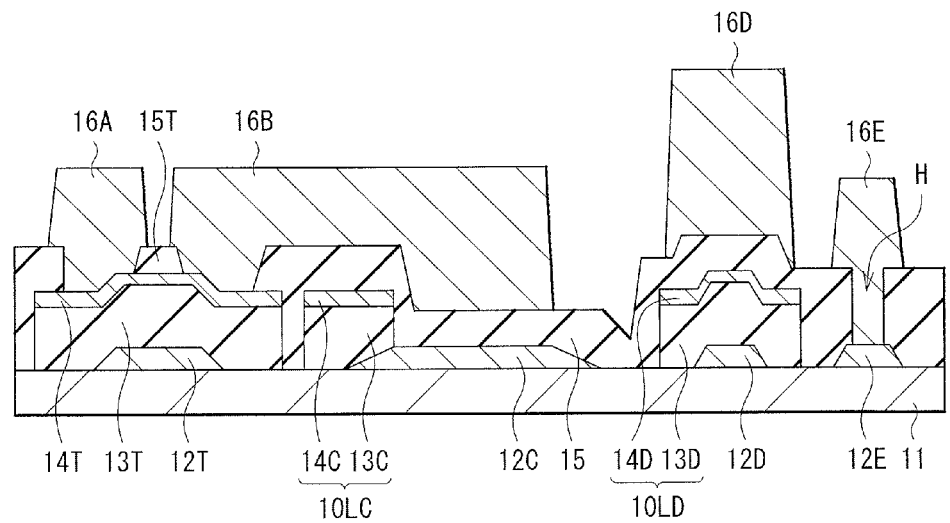
FIG. 6C is a cross-sectional view illustrating a step following the step of FIG. 6B.

After the channel protective film 15T and the first insulating film 15 are provided, a metal film is formed on the whole surface of the substrate 11, for example, by a sputtering method. The metal film is patterned by an etching method to form the source-drain electrodes 16A and 16B, the upper electrode 16C, the second wiring 16D, and the fourth wiring 16E as illustrated in FIG. 6C. Thereby, the transistor 10T and the capacitor 10C are formed, and the fourth wiring 16E is electrically connected to the third wiring 12E through the connection hole H. As the etching of the metal film, wet etching using a mixed solution containing, for example, phosphoric acid, nitric acid, and acetic acid may be performed.

After the transistor 10T and the capacitor 10C are provided, the passivation film 17 is formed. The passivation film 17 may be formed, for example, by a sputtering method. Specifically, the passivation film 17 may be formed in argon atmosphere containing oxygen or nitrogen atmosphere by a metal target or an electrically conductive target obtained by adding impurity to a metal oxide. By improving film formation density, permeability of oxygen and hydrogen is lowered, and thereby, performance as a protective film is allowed to be improved.

Through the foregoing steps, the semiconductor device 10 illustrated in FIG. 1 is completed. For example, after the pixel drive circuit 140 including the semiconductor device 10 is provided as described above, a display layer is formed to manufacture the display unit 1.

In the display unit 1, a scanning signal is supplied from the scanning line drive circuit 130 to the respective pixels 10 through the gate electrode of the writing transistor Tr2, and an image signal from the signal line drive circuit 120 is retained in the capacitor 10C through the writing transistor Tr2. That is, the drive transistor Tr1 is of-off controlled according to the signal retained in the capacitor 10C, and thereby, a drive current is injected into the pixel 100. In the transistors Tr1 and Tr2 (the transistor 10T), when a voltage (a gate voltage) equal to or larger than the threshold voltage is applied to the gate electrode 12T, a current (a drain current) is generated in the channel region of the channel film 14T between the source-drain electrode 16A and the source-drain electrode 16B, and driving is performed as described above.

The laminated structure 10LC is provided on the rim section 12CE of the lower electrode 12C here. Therefore, while insulation properties between the lower electrode 12C and the upper electrode 16C are retained, the capacity value of the capacitor 10C is allowed to be improved. Description will be given thereof below in detail.

Figure 7:
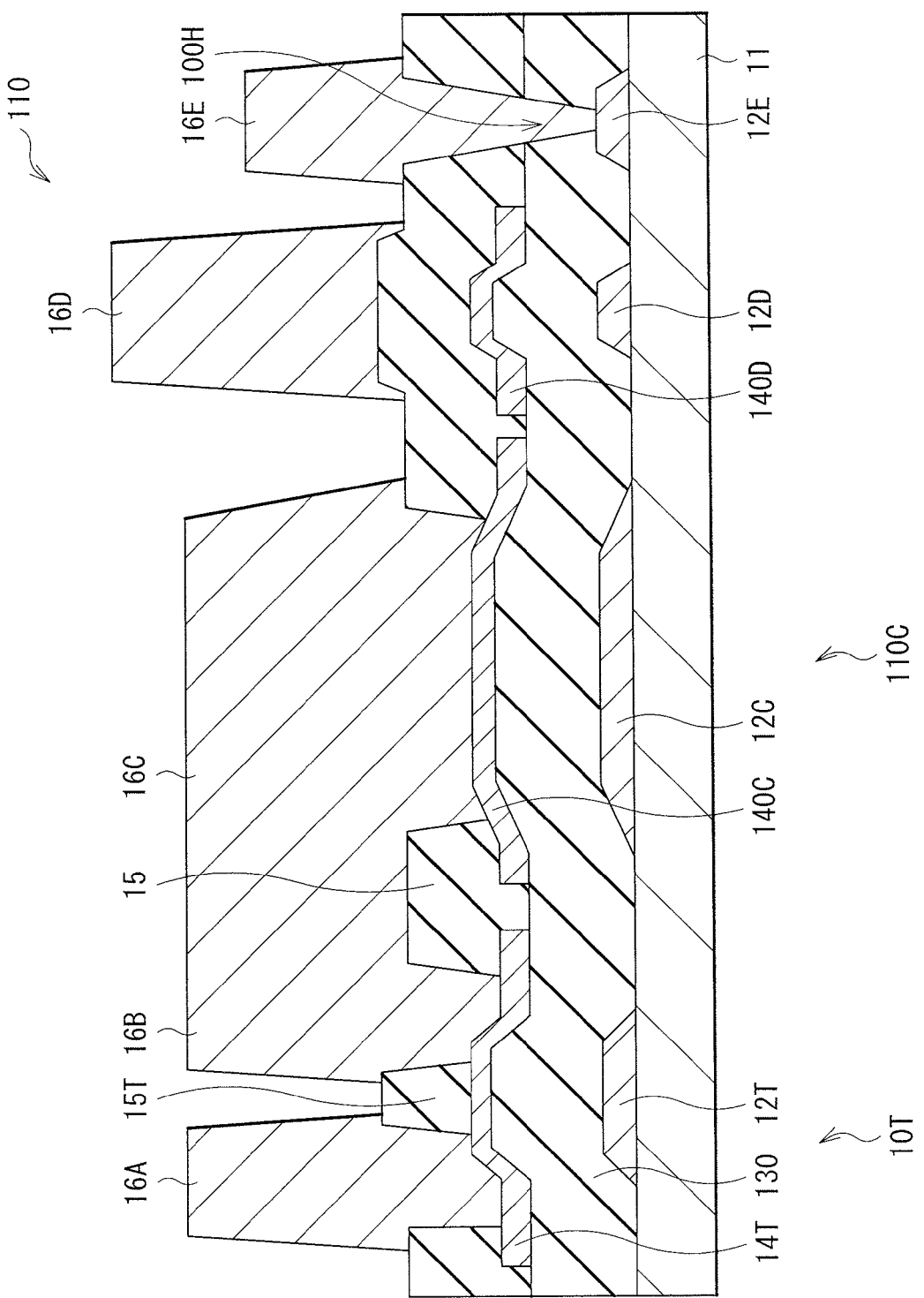
FIG. 7 is a cross-sectional view illustrating a configuration of a semiconductor device according to Comparative example 1.

FIG. 7 illustrates a cross-sectional configuration of a semiconductor device (a semiconductor device 110) according to a comparative example. In a capacitor 110C of the semiconductor device 110, a second insulating film 130 and a semiconductor film 140C are provided between the lower electrode 12C and the upper electrode 16C. The second insulating film 130 also serves as a gate insulating film of the transistor 10T, and is provided on the whole surface of the substrate 11. In the transistor 10T of the semiconductor device 110, the channel protective film 15T is provided as in the semiconductor device 10.

In such a transistor 10T having the channel protective film 15T, it is necessary to precisely locate the channel protective film 15T together with the source-drain electrodes 16A and 16B with respect to the gate electrode 12T. Therefore, a margin portion is necessitated in view of position gap among the gate electrode 12T, the channel protective film 15T, and the source-drain electrodes 16A and 16B. That is, a region where the gate electrode 12T overlaps the source-drain electrodes 16A and 16B is widened, and a parasitic capacity between the gate electrode 12T and the source-drain electrodes 16A and 16B is easily increased. Since such a parasitic capacity may cause display unevenness and the like, it is necessary to increase the capacity value of the capacitor 110C configuring the semiconductor device 110 together with the transistor 10T.

For example, to improve the capacity value of the capacitor 110C by changing the semiconductor film 140C on the lower electrode 12C into a conducting body may be contemplated. To change the semiconductor film 140C into a conducting body may be performed, for example, by plasma treatment. Electric conductivity of the semiconductor film 140C changed into the conducting body as described above is not stable, and therefore, it is difficult to stably retain the capacity value of the capacitor 110C.

Further, in order to increase the capacity value of the capacitor 100C, for example, increasing the area of the capacitor 110C may be contemplated. However, such a method is less likely to be achieved in view of the pixel layout.

The capacity value of the capacitor 110C may be also improved by decreasing the film thickness of the second insulating film 130, or by changing the film quality of the second insulating film 130 to increase the dielectric constant. Description will be given below of capacity values of respective capacitors (after-described capacitors 10CR, 110CR, and 111CR) in which the respective insulating films between the lower electrode 12C and the upper electrode 16C vary from each other.

Figure 8A:
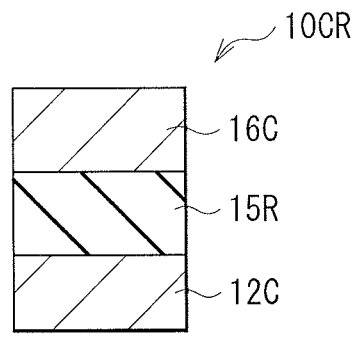
FIG. 8A is a cross-sectional view illustrating an example of a configuration of a capacitor.
Figure 8B:
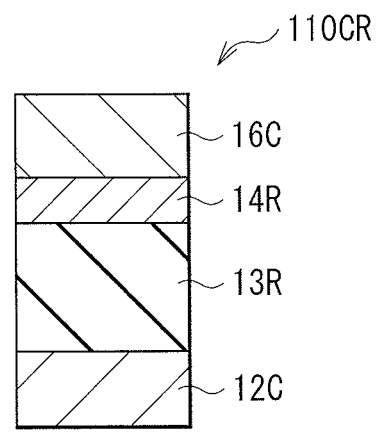
FIG. 8B is a cross-sectional view illustrating another example of a configuration of a capacitor.
Figure 8C:
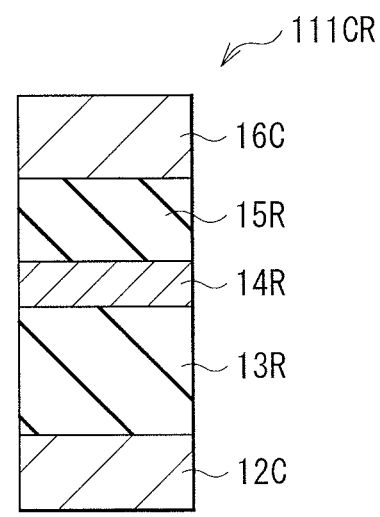
FIG. 8C is a cross-sectional view illustrating still another example of a configuration of a capacitor.

FIG. 8A, FIG. 8B, and FIG. 8C illustrate cross-sectional configurations of the capacitors 10CR, 110CR, and 111CR each having a different configuration of each insulating film between the lower electrode 12C and the upper electrode 16C. Between the lower electrode 12C and the upper electrode 16C, the capacitor 10CR has a first insulating film 15R (FIG. 8A), the capacitor 110CR has a second insulating film 13R and a semiconductor film 14R (FIG. 8B), and the capacitor 111CR has the second insulating film 13R, the semiconductor film 14R, and the first insulating film 15R (FIG. 8C). Each of the second insulating film 13R and the first insulating film 15R is formed of a silicon oxide film. The film thickness ratio between the second insulating film 13R and the first insulating film 15R is [second insulating film 13R:first insulating film 15R=4:3]. The film quality of the second insulating film 13R and the film quality of the first insulating film 15R are different from each other. Such film qualities may be controlled, for example, by a film formation method (a process recipe), a film formation equipment, a posttreatment process, and the like.

Figure 9:
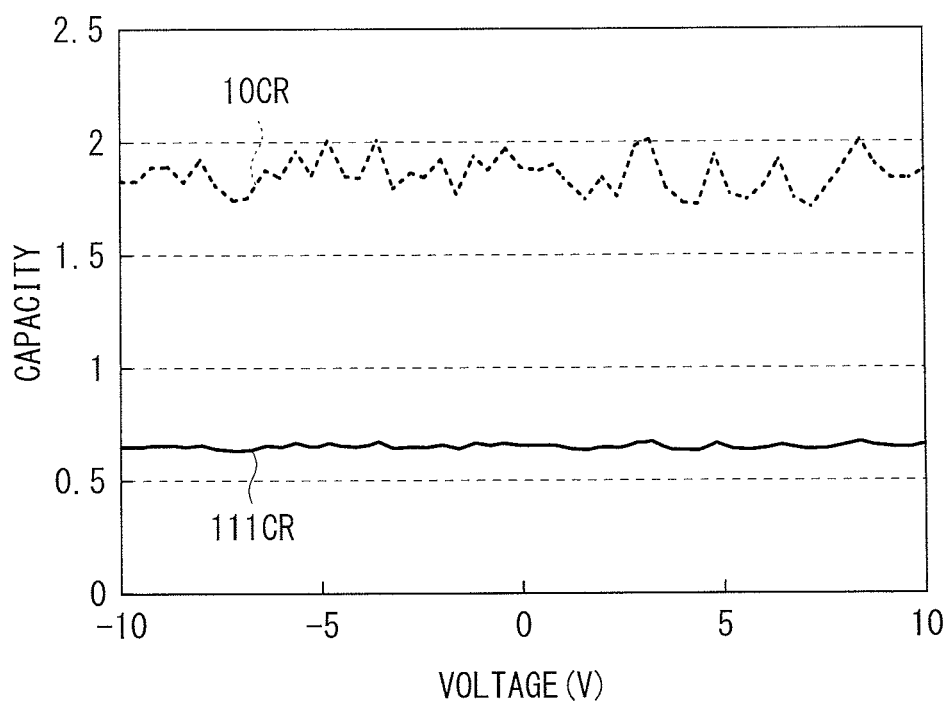
FIG. 9 is a diagram illustrating relations between applied voltages and capacity values of the capacitors illustrated in FIG. 8A to FIG. 8C.

FIG. 9 illustrates capacity values of the capacitors 10CR and 111CR under condition that the capacity value of the capacitor 110CR is regarded as 1. In the capacitor 111CR having the first insulating film 15R in addition to the second insulating film 13R and the semiconductor film 14R between the lower electrode 12C and the upper electrode 16C, the capacity value thereof is lowered down to about 60% of that of the capacitor 110CR. In contrast, the capacity value of the capacitor 10CR having only the first insulating film 15R between the lower electrode 12C and the upper electrode 16C is improved to a value close to a value double the size of that of the capacitor 110CR. FIG. 9 illustrates a case in which the film thickness and the film quality of the second insulating film 13R and those of the first insulating film 15R vary from each other. However, in the case where the film quality, that is, the dielectric constant of the second insulating film 13R and that of the first insulating film 15R are the same as each other, and only the film thicknesses thereof vary from each other, the capacity value of the capacitor 10CR is improved about 30% compared to that of the capacitor 110CR.

As described above, by changing the film thickness or the dielectric constant of the insulating film between the lower electrode 12C and the upper electrode 16C, the capacity value of the capacitor is allowed to be improved. However, in the second insulting film 130 (FIG. 7) also serving as a gate insulating film of the transistor 10T, changing its film thickness or its dielectric constant may result in lowered reliability of the transistor 10T.

Figure 10:
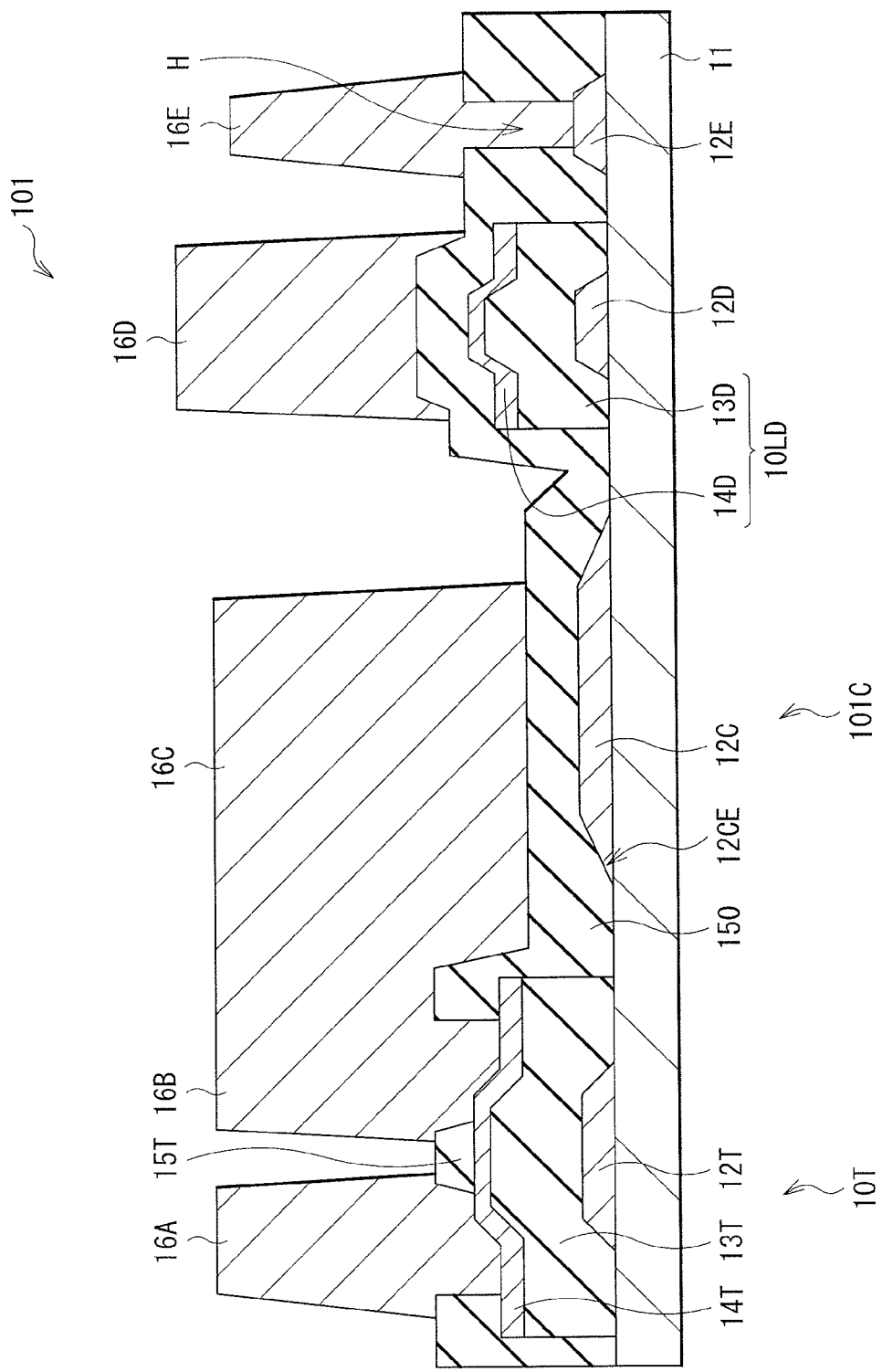
FIG. 10 is a cross-sectional view illustrating a configuration of a semiconductor device according to Comparative example 2.

FIG. 10 illustrates a cross-sectional configuration of a semiconductor device (a semiconductor device 101) according to Comparative example 2. In a capacitor 101C of the semiconductor device 101, an insulating film (a first insulating film 150) separately from the gate insulting film configuring the transistor 10T is provided between the lower electrode 12C and the upper electrode 16C. For the first insulating film 150, the film thickness and the film quality may be freely designed. The first insulating film 150 may be formed, for example, concurrently with the channel protective film 15T of the transistor 10T. The first insulating film 150 may be made of the same material as that of the channel protective film 15T, and may have the same film thickness as that of the channel protective film 15T.

However, in the case where the first insulating film 150 is formed thin, current leakage between the lower electrode 12C and the upper electrode 16C easily occurs in the vicinity of the rim section 12CE of the lower electrode 12C. One reason for this is that, in the periphery of the lower electrode 12C, the shape thereof is easily disordered due to anisotropic growth and/or the like at the time of forming the lower electrode 12C. In the rim section of the lower electrode 12C, for example, a convex portion may be easily formed on the surface of the lower electrode 12C, and the first insulating film 150 having a small thickness may not sufficiently cover the lower electrode 12C having the convex portion. By forming the upper electrode 16C inside the location of the lower electrode 12C, such current leakage is allowed to be prevented from occurring. However, since the upper electrode 16C is connected to another wiring (such as the source-drain electrode 12B), part of the rim (the rim section 12CE) of the lower electrode 12C is covered with the upper electrode 16C. In a portion where the rim section 12CE of the lower electrode 12C is overlapped with the upper electrode 16C, current leakage easily occurs.

In contrast, in the semiconductor device 10, the laminated structure 10LC is provided on the rim section 12CE of the lower electrode 12C. Therefore, together with the first insulating film 15, the rim section 12CE of the lower electrode 12C is covered with the second insulating film 13C of the laminated structure 10LC. Thereby, while the film thickness of the first insulating film 15 between the lower electrode 12C and the upper electrode 16C is decreased in portions other than the rim section 12CE, insulation properties between the lower electrode 12C and the upper electrode 16C are allowed to be retained in the rim section 12CE of the lower electrode 12C. That is, while reliability of the capacitor 10C is retained, the capacity value is allowed to be improved. In the rim section 12CE of the lower electrode 12C, it may be preferable that the laminated structure 10LC cover a portion from part of the surface of the lower electrode 12C to the whole surface thereof so that the foregoing convex portion resulting from the anisotropic growth and the like is totally covered.

Further, the first insulating film 15 between the lower electrode 12C and the upper electrode 16C is provided separately from the gate insulating film 13T. Therefore, even when the first insulating film 15 is formed thin, reliability of the transistor 10T is not affected thereby.

Figure 11:
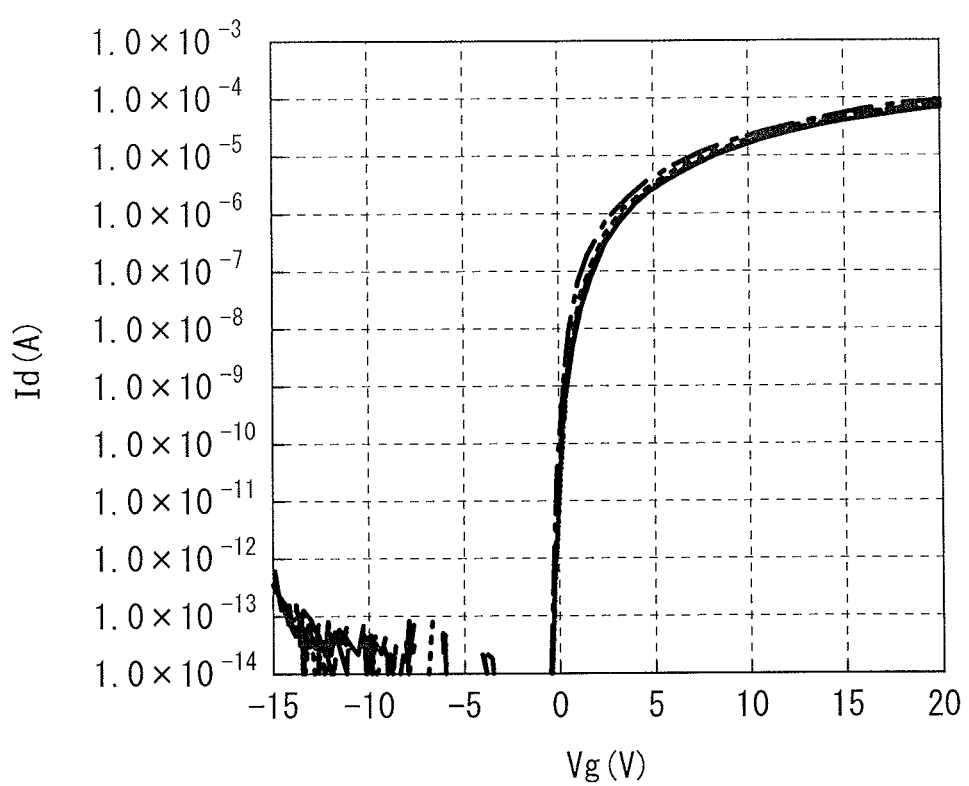
FIG. 11 is a diagram illustrating an example of IV characteristics of a transistor illustrated in FIG. 1.

FIG. 11 illustrates an example of I-V characteristics of the transistor 10T of the semiconductor device 10. By providing the appropriate gate insulating film 13T, the transistor 10T shows stable transistor characteristics.

Further, the laminated structure 10LC is allowed to be formed concurrently with the gate insulating film 13T and the channel film 14T of the transistor 10T (FIG. 6A). In other words, the gate insulating film 13T, the channel film 14T, and the laminated structure 10LC are formed by one patterning step. Therefore, the laminated structure 10LC is allowed to be formed on the rim section 12CE of the lower electrode 12C without increasing the number of steps.

In addition thereto, between the first wiring 12D and the second wiring 16D that are provided in layers different from each other, the laminated structure 10LD is provided in addition to the first insulating film 15. In a portion where a wiring of an upper layer intersects with a wiring of a lower layer, a parasitic capacity generated between the wirings may be preferably small. Referring to the capacity value of the capacitor 101CR illustrated in FIG. 9, it is found that a parasitic capacity in an intersection of wirings is decreased by increasing the thickness of an insulating film between the wirings. The thickness of the insulating film between the wirings is increased by providing the laminated structure 10LD together with the first insulating film 15, compared to in the case in which only the first insulating film 15 is provided between the first wiring 12D and the second wiring 16D. Therefore, the parasitic capacity between the first wiring 12D and the second wiring 16D is allowed to be suppressed. The laminated structure 10LD between the first wiring 12D and the second wiring 16D is allowed to be formed concurrently with the laminated structure 10LC on the rim section 12CE of the lower electrode 12C.

Furthermore, in the semiconductor device 10, the insulating material film 13M is patterned with the use of the same mask as that of the semiconductor material film 14M. Therefore, before forming the connection hole H, the insulating material film 13M covering the third wiring 12E is allowed to be removed (FIG. 6A). Description will be given below thereof in comparison with steps of manufacturing the foregoing semiconductor device 100 (FIG. 7).

Figure 12A:
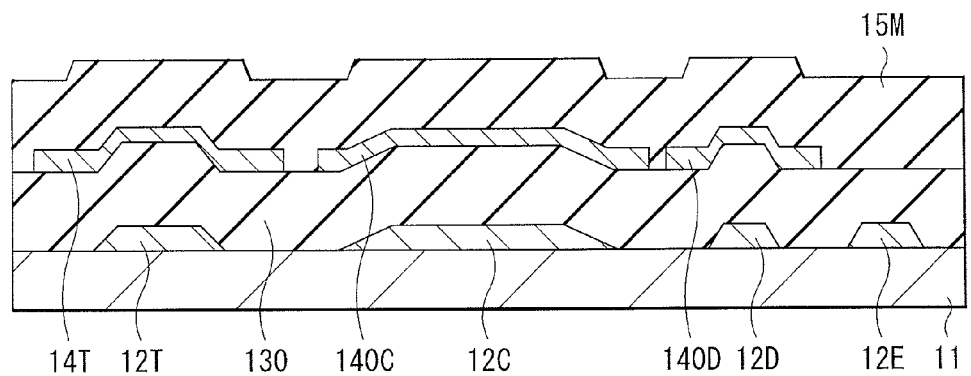
FIG. 12A is a cross-sectional view illustrating a step of manufacturing the semiconductor device illustrated in FIG. 7.
Figure 12B:
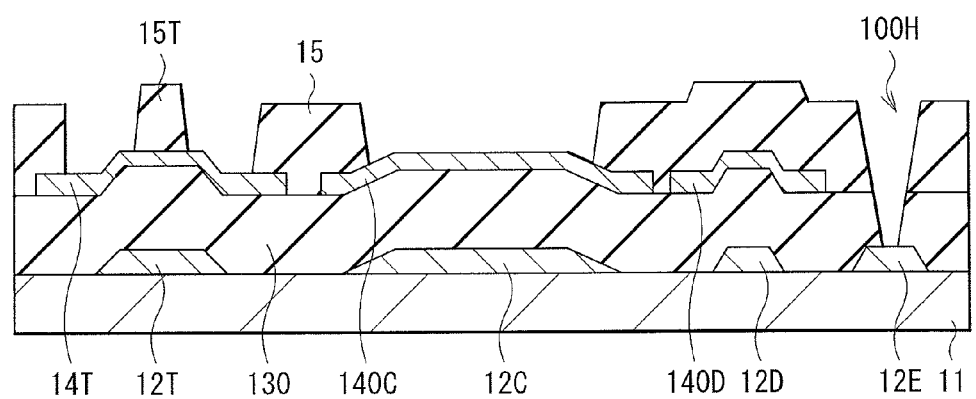
FIG. 12B is a cross-sectional view illustrating a step following the step of FIG. 12A.

FIG. 12A and FIG. 12B illustrate the steps of manufacturing the semiconductor device 100. In the semiconductor device 100, the second insulating film 130 is provided on the whole surface of the substrate 11, and the second insulating film 130 is not patterned. In the steps of manufacturing the semiconductor device 100, first, the second insulating film 130 and a semiconductor material film (not illustrated) are formed in this order. Thereafter, only the semiconductor film is patterned to form the channel film 14T, the semiconductor film 140C on the lower electrode 12C, and the semiconductor film 140D on the first wiring 12D. Next, an insulating material film 15M is formed on the whole surface of the substrate 11 (FIG. 12A). Thereafter, with the use of the channel film 14T and the semiconductor film 140C as an etching stopper, the insulating material film 15M is patterned to form the channel protective film 15T and the first insulating film 15 (FIG. 12B).

After forming the insulating material film 15M, the third wiring 12E is covered with the second insulating film 130 and the insulating material film 15M (the first insulating film 15). Therefore, in order to form the connection hole H, it is necessary to remove the second insulating film 130 together with the insulating material film 15M. Therefore, etching time of the connection hole H is lengthened, and the channel film 14T and the semiconductor film 140C are exposed under etching conditions for a long time. At this time, in the case where the channel film 14T and the semiconductor film 140C have a pinhole, the second insulating film 130 located in a layer lower than the layer of the channel film 14T and the semiconductor film 140C may be etched through the pinhole. Such etching of the second insulating film 130 may cause short circuit between the gate electrode 12T and the source-drain electrodes 16A and 16B. Similarly, short circuit may also occur between the lower electrode 12C and the upper electrode 16C.

In contrast, in the semiconductor 10, the insulating material film 13M covering the third wiring 12E is removed at the time of patterning the semiconductor material film 14M. Therefore, it is enough that the connection hole H is formed to penetrate through only the first insulating film 15, and long-time etching is not necessitated. Therefore, the gate insulating film 13T located in a layer lower than that of the channel film 14T is prevented from being etched. That is, occurrence of short circuit between the gate electrode 12T and the source-drain electrodes 16A and 16B may be suppressed to improve reliability of the transistor 10T.

As described above, in the semiconductor 10 according to this embodiment, the laminated structure 10LC is provided on the rim section 12CE of the lower electrode 12C. Therefore, while insulation properties between the lower electrode 12C and the upper electrode 16C are retained, the capacity value of the capacitor 10C is allowed to be improved.

[Module]

Figure 13:
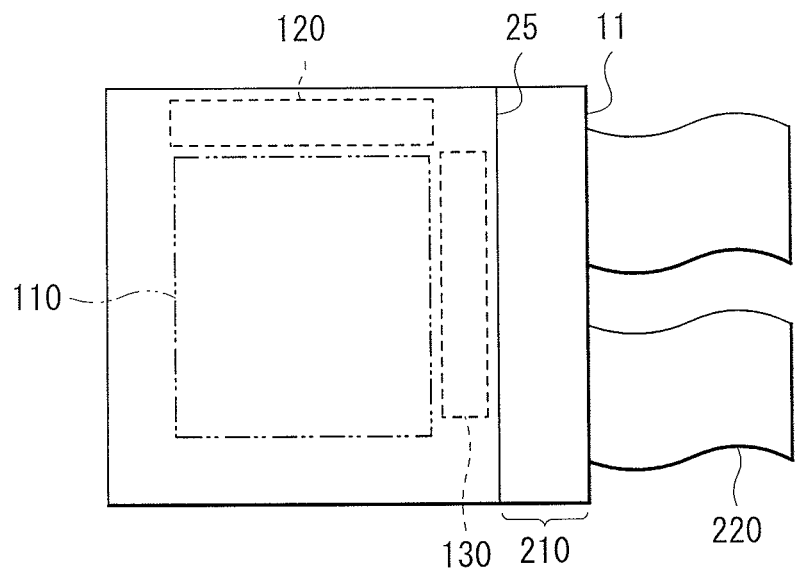

For example, the display unit 1 including the semiconductor device 10 according to the foregoing embodiment may be incorporated in various electronic apparatuses such as after-described Application examples 1 to 5 as a module as illustrated in FIG. 13, for example. In the module, for example, a region 210 exposed from an opposed substrate 25 is provided in one side of the substrate 11, wirings of the signal line drive circuit 120 and the scanning line drive circuit 130 are extended to the exposed region 210 to form an external connection terminal (not illustrated). The external connection terminal may be provided with a Flexible Printed Circuit (FPC) 220 to input and output a signal.

Application Example 1

Figure 14:
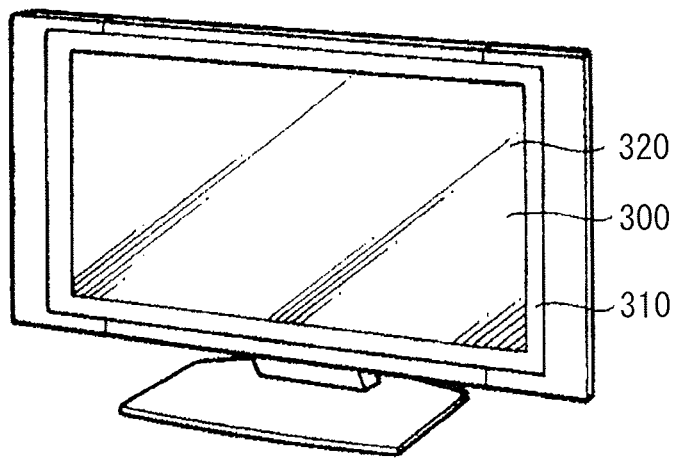
FIG. 14 is a perspective view illustrating an appearance of Application example 1.

FIG. 14 illustrates an appearance of a television to which the foregoing display unit 1 is applied. The television may have, for example, an image display screen section 300 including a front panel 310 and a filter glass 320. The image display screen section 300 is configured of the foregoing display unit 1.

Application Example 2

Figure 15A:
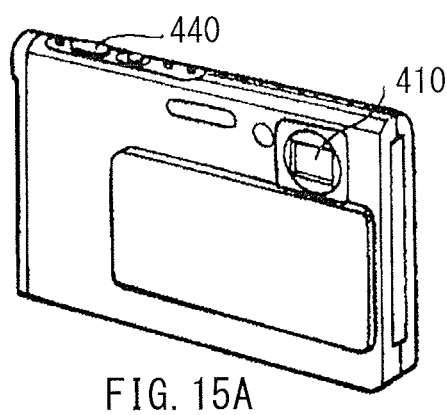
FIG. 15A is a perspective view illustrating an appearance viewed from the front side of Application example 2.
Figure 15B:
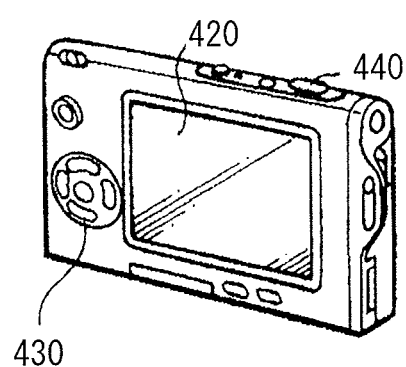
FIG. 15B is a perspective view illustrating an appearance viewed from the rear side of Application example 2.

FIGS. 15A and 15B illustrate appearances of a digital camera to which the foregoing display unit 1 is applied. The digital camera may have, for example, a light emitting section 410 for a flash, a display section 420, a menu switch 430, and a shutter button 440. The display section 420 is configured of the foregoing display unit 1.

Application Example 3

Figure 16:
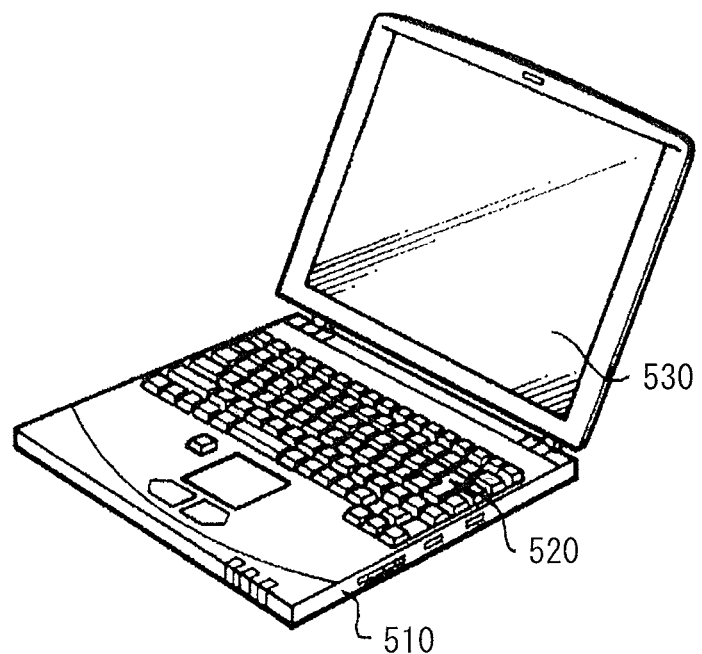
FIG. 16 is a perspective view illustrating an appearance of Application example 3.

FIG. 16 illustrates an appearance of a notebook personal computer to which the foregoing display unit 1 is applied. The notebook personal computer may have, for example, a main body 510, a keyboard 520 for operation of inputting characters and the like, and a display section 530 for displaying an image. The display section 530 is configured of the foregoing display unit 1.

Application Example 4

Figure 17:
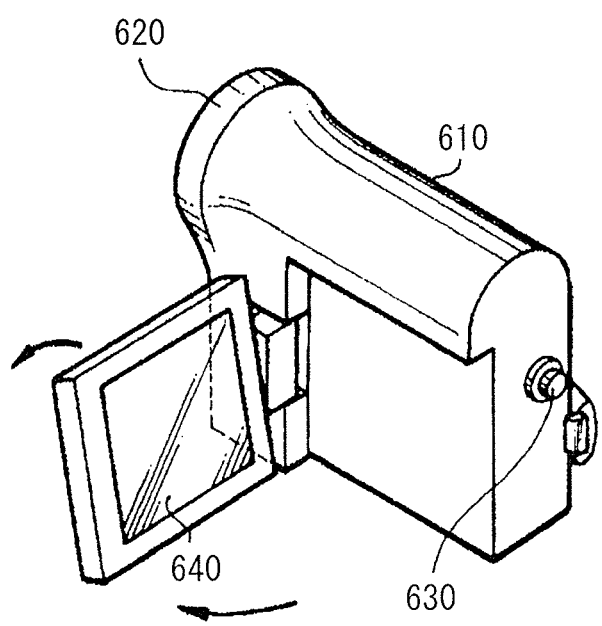
FIG. 17 is a perspective view illustrating an appearance of Application example 4.

FIG. 17 illustrates an appearance of a video camcorder to which the foregoing display unit 1 is applied. The video camcorder may have, for example, a main body 610, a lens 620 for shooting a subject provided on the front side surface of the main body 610, a start-stop switch 630 for shooting, and a display section 640. The display section 640 is configured of the foregoing display unit 1.

Application Example 5

Figure 18A:
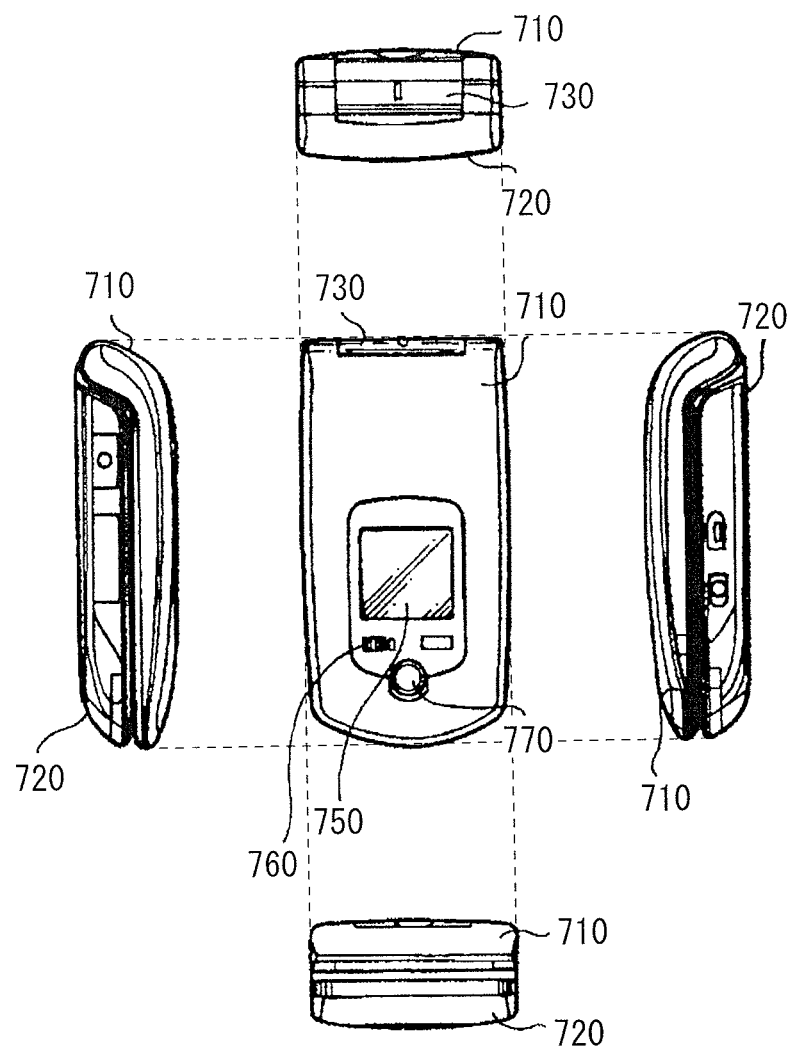
FIG. 18A is a diagram illustrating a closed state of Application example 5.
Figure 18B:
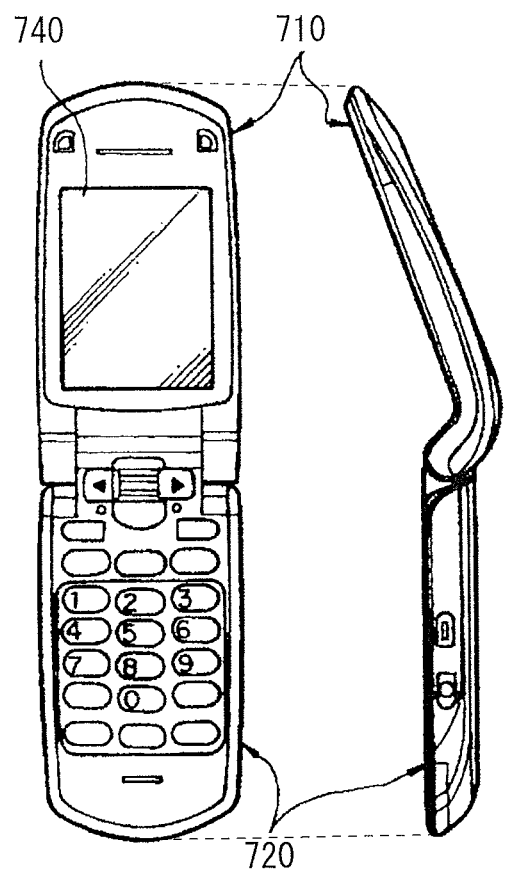
FIG. 18B is a diagram illustrating an open state of Application example 5.

FIGS. 18A and 18B illustrate appearances of a mobile phone to which the foregoing display unit is applied. In the mobile phone, for example, an upper package 710 and a lower package 720 may be jointed by a joint section (hinge section) 730. The mobile phone may have a display 740, a sub-display 750, a picture light 760, and a camera 770. Either one or both of the display 740 and the sub-display 750 are configured of the foregoing display unit 1.

Figure 19:
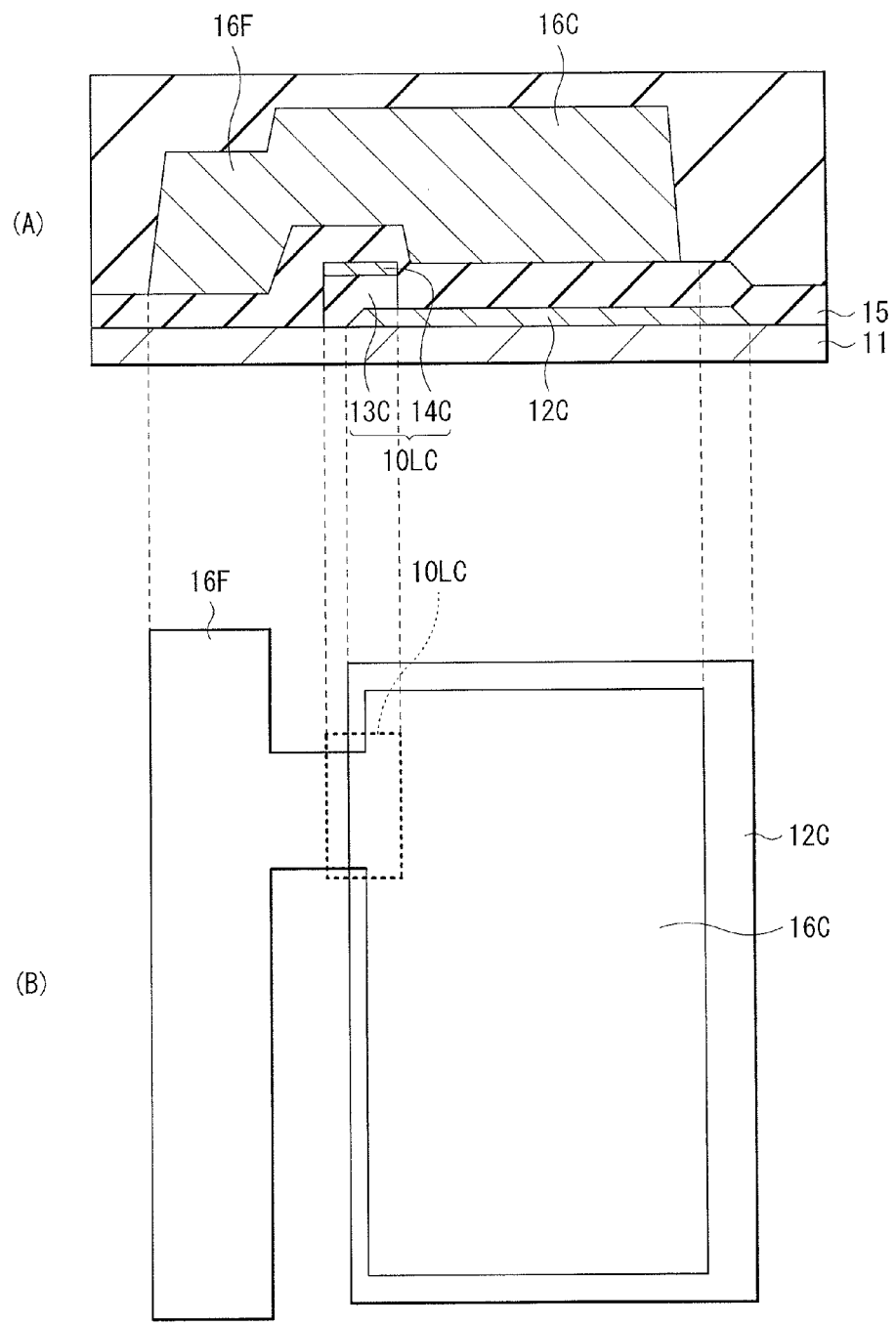
FIG. 19 is a diagram illustrating another example of the semiconductor device illustrated in FIG. 1.

While the present application has been described with reference to the embodiment, the present application is not limited to the foregoing embodiment, and various modifications may be made. For example, in the foregoing semiconductor device 10, the description has been given of the case in which the capacitor 10C and the transistor 10T are adjacent to each other. However, the capacitor 10C may be arranged distantly from the transistor 10T. The upper electrode 16C of the capacitor 10C may not be connected to the source-drain electrode 16B, and, for example, as illustrated in FIG. 19, may be electrically connected to a wiring 16F such as an electric power voltage supply line and a signal line.

Further, in the foregoing embodiment and the like, the description has been given of the case in which the planar shapes of the second insulating film 13C and the semiconductor film 14C are the same, and the planar shapes of the second insulating film 13D and the semiconductor film 14D are the same (FIG. 6A). However, the insulating material film 13M having a reduced thickness may be left in portions other than the gate insulating film 13T and the laminated structures 10LC and 10LD.

Further, the display layer of the display unit 1 may be any type, and may be, for example, an organic layer including a light emitting layer, a liquid crystal layer, an inorganic layer including a light emitting layer, an electrophoretic layer, or the like.

In addition thereto, the material, the thickness, the film-forming method, the film-forming conditions, and the like of each layer are not limited to those described in the foregoing embodiment and the like, and other material, other thickness, other film-forming method, and other film-forming conditions may be adopted.

It is possible to achieve at least the following configurations from the above-described example embodiments of the disclosure.

(1) A semiconductor device, including:
a capacitor including a first insulating film between a lower electrode and an upper electrode; and
a first laminated structure including a second insulating film and a semiconductor film, the second insulating film and the semiconductor film being located between part or all of a rim of the lower electrode and the first insulating film.

(2) The semiconductor device according to (1), wherein the lower electrode, the second insulating film, the semiconductor film, the first insulating film, and the upper electrode are arranged in this order in the rim of the lower electrode.

(3) The semiconductor device according to (1) or (2), wherein the first insulating film is in contact with the lower electrode and the upper electrode in regions other than a portion where the first laminated structure is provided.

(4) The semiconductor device according to any one of (1) to (3), wherein a film thickness of the first insulating film is smaller than a film thickness of the second insulating film.

(5) The semiconductor device according to any one of (1) to (4), wherein planar shapes of the second insulating film and the semiconductor film are same as each other.

(6) The semiconductor device according to any one of (1) to (5), wherein
part of the upper electrode is projected outside the lower electrode in a planar view, and
the first laminated structure is provided in a location opposed to a projecting portion of the upper electrode.

(7) The semiconductor device according to any one of (1) to (6), further including a transistor that includes a gate insulating film, a channel film, and a channel protective film in this order on a gate electrode, wherein
the channel protective film is made of a material that is same as a material of the first insulating film.

(8) The semiconductor device according to (7), wherein the gate electrode, the channel film, and the gate insulating film are made of materials that are respectively same as materials of the lower electrode, the semiconductor film, and the second insulating film.

(9) The semiconductor device according to (7) or (8), wherein the transistor includes source-drain electrodes electrically connected to the channel film, and
each of the source-drain electrodes is made of a material that is same as a material of the upper electrode.

(10) The semiconductor device according to any one of (1) to (9), further including:
a first wiring; and
a second wiring, part or all of the second wiring being opposed to the first wiring, wherein
a second laminated structure and the first insulating film are laminated and arranged between the first wiring and the second wiring, the second laminated structure having a configuration that is the same as a configuration of the first laminated structure.

(11) The semiconductor device according to any one of (1) to (10), wherein the semiconductor film is made of an oxide semiconductor material.

(12) A display unit provided with a display layer and a semiconductor device driving the display layer, the semiconductor device including:

a capacitor including a first insulating film between a lower electrode and an upper electrode; and a first laminated structure including a second insulating film and a semiconductor film, the second insulating film and the semiconductor film being located between part or all of a rim of the lower electrode and the first insulating film.

(13) An electronic apparatus provided with a display unit including a display layer and a semiconductor device driving the display layer, the semiconductor device including:

a capacitor having a first insulating film between a lower electrode and an upper electrode; and a first laminated structure including a second insulating film and a semiconductor film, the second insulating film and the semiconductor film being located between part or all of a rim of the lower electrode and the first insulating film.

(14) A method of manufacturing a semiconductor device, the method including:

forming a lower electrode;

forming a laminated structure on part or all of a rim of the lower electrode, the laminated structure including an insulating film (a second insulating film) and a semiconductor film; and providing an upper electrode to be opposed to the lower electrode and the laminated structure with a first insulating film in between to form a capacitor.

(15) The method according to (14), wherein the semiconductor film and the second insulating film are patterned with the use of same mask.

(16) The method according to (15), wherein a transistor is formed together with the capacitor, the transistor having a gate insulating film, a channel film, and a channel protective film in this order on a gate electrode, and respective combinations of the gate insulating film and the second insulating film, the channel film and the semiconductor film, and the channel protective film and the first insulating film are formed in respective same steps with the use of respective same masks.

(17) The method according to any one of (14) to (16), wherein a third wiring is formed in a layer that is same as a layer of the lower electrode, the third wring is covered with an insulating material film and a semiconductor material film, the insulating material film being made of a material that is same as a material of the second insulating film, and the semiconductor material film being made of a material that is same as a material of the semiconductor film, the insulating material film and the semiconductor material film that cover the third wiring are removed, and thereafter, the third wiring is covered with the first insulating film, and a connection hole is formed, the connection hole penetrating through the first insulating film to reach the third wiring.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device, comprising:
    a capacitor including a first insulating film between a lower electrode and an upper electrode;
    a first laminated structure including a second insulating film and a semiconductor film, the second insulating film and the semiconductor film being located between part or all of a rim of the lower electrode and the first insulating film;
    a first wiring; and
    a second wiring, part or all of the second wiring being opposed to the first wiring, wherein
    a second laminated structure and the first insulating film are laminated and arranged between the first wiring and the second wiring, the second laminated structure having a configuration that is the same as a configuration of the first laminated structure.

2. The semiconductor device according to claim 1, wherein the lower electrode, the second insulating film, the semiconductor film, the first insulating film, and the upper electrode are arranged in this order in the rim of the lower electrode.

3. The semiconductor device according to claim 1, wherein the first insulating film is in contact with the lower electrode and the upper electrode in regions other than a portion where the first laminated structure is provided.

4. The semiconductor device according to claim 1, wherein a film thickness of the first insulating film is smaller than a film thickness of the second insulating film.

5. The semiconductor device according to claim 1, wherein planar shapes of the second insulating film and the semiconductor film are same as each other.

6. The semiconductor device according to claim 1, wherein
    part of the upper electrode is projected outside the lower electrode in a planar view, and
    the first laminated structure is provided in a location opposed to a projecting portion of the upper electrode.

7. The semiconductor device according to claim 1, further comprising a transistor that includes a gate insulating film, a channel film, and a channel protective film in this order on a gate electrode, wherein
    the channel protective film is made of a material that is same as a material of the first insulating film.

8. The semiconductor device according to claim 7, wherein the gate electrode, the channel film, and the gate insulating film are made of materials that are respectively same as materials of the lower electrode, the semiconductor film, and the second insulating film.

9. The semiconductor device according to claim 7, wherein the transistor includes source-drain electrodes electrically connected to the channel film, and
    each of the source-drain electrodes is made of a material that is same as a material of the upper electrode.

10. The semiconductor device according to claim 1, wherein the semiconductor film is made of an oxide semiconductor material.

11. A display unit provided with a display layer and a semiconductor device driving the display layer, the semiconductor device comprising:
    a capacitor including a first insulating film between a lower electrode and an upper electrode;

a first laminated structure including a second insulating film and a semiconductor film, the second insulating film and the semiconductor film being located between part or all of a rim of the lower electrode and the first insulating film;

a first wiring; and a second wiring, part or all of the second wiring being opposed to the first wiring, wherein a second laminated structure and the first insulating film are laminated and arranged between the first wiring and the second wiring, the second laminated structure having a configuration that is the same as a configuration of the first laminated structure.

12. An electronic apparatus provided with a display unit including a display layer and a semiconductor device driving the display layer, the semiconductor device comprising:

a capacitor having a first insulating film between a lower electrode and an upper electrode;

a first laminated structure including a second insulating film and a semiconductor film, the second insulating film and the semiconductor film being located between part or all of a rim of the lower electrode and the first insulating film, a first wiring; and a second wiring, part or all of the second wiring being opposed to the first wiring, wherein a second laminated structure and the first insulating film are laminated and arranged between the first wiring and the second wiring, the second laminated structure having a configuration that is the same as a configuration of the first laminated structure.

13. A method of manufacturing a semiconductor device, the method comprising:

forming a lower electrode;

forming a laminated structure on part or all of a rim of the lower electrode, the laminated structure including a second insulating film and a semiconductor film;

providing an upper electrode to be opposed to the lower electrode and the laminated structure with a first insulating film in between to form a capacitor providing a first wiring; and providing a second wiring, part or all of the second wiring being opposed to the first wiring, wherein a second laminated structure and the first insulating film are laminated and arranged between the first wiring and the second wiring, the second laminated structure having a configuration that is the same as a configuration of the laminated structure.

14. The method according to claim 13, wherein the semiconductor film and the second insulating film are patterned with the use of same mask.

15. The method according to claim 14, wherein a transistor is formed together with the capacitor, the transistor having a gate insulating film, a channel film, and a channel protective film in this order on a gate electrode, and respective combinations of the gate insulating film and the second insulating film, the channel film and the semiconductor film, and the channel protective film and the first insulating film are formed in respective same steps with the use of respective same masks.

16. The method according to claim 13, wherein a third wiring is formed in a layer that is same as a layer of the lower electrode, the third wring is covered with an insulating material film and a semiconductor material film, the insulating material film being made of a material that is same as a material of the second insulating film, and the semiconductor material film being made of a material that is same as a material of the semiconductor film, the insulating material film and the semiconductor material film that cover the third wiring are removed, and thereafter, the third wiring is covered with the first insulating film, and a connection hole is formed, the connection hole penetrating through the first insulating film to reach the third wiring.

* * * * *